(12) United States Patent
Edmond et al.

(10) Patent No.: US 8,154,039 B2
(45) Date of Patent: Apr. 10, 2012

(54) HIGH EFFICIENCY GROUP III NITRIDE LED WITH LENTICULAR SURFACE

(75) Inventors: John Adam Edmond, Durham, NC (US); David Beardsley Slater, Jr., Baskerville, VA (US); Jayesh Bharathan, Cary, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/401,832

(22) Filed: Mar. 11, 2009

(65) Prior Publication Data
US 2009/0166659 A1  Jul. 2, 2009

Related U.S. Application Data

(60) Division of application No. 11/082,470, filed on Mar. 17, 2005, which is a continuation-in-part of application No. 10/951,042, filed on Sep. 22, 2004, now Pat. No. 7,259,402.

(51) Int. Cl.
*H01L 33/00* (2010.01)
(52) U.S. Cl. .................. 257/98; 257/E33.068
(58) Field of Classification Search ............ 257/98, 257/E33.068
See application file for complete search history.

(56) References Cited

U.S. PATENT DOCUMENTS

| | | | |
|---|---|---|---|
| 2,001,622 A | 5/1935 | McCaa | |
| 4,626,322 A | 12/1986 | Switzer | |
| 4,675,875 A | 6/1987 | Takamlya et al. | |
| 4,703,219 A | 10/1987 | Mesquida | |
| 4,902,356 A | 2/1990 | Noguchi et al. | |
| 4,912,532 A | 3/1990 | Cook et al. | |
| 4,946,547 A | 8/1990 | Palmour et al. ............... 156/643 |
| 4,990,972 A | 2/1991 | Satoh et al. | |
| 5,103,271 A | 4/1992 | Izumiya et al. | |
| 5,153,889 A | 10/1992 | Sugawara et al. ............... 372/45 |
| 5,162,878 A | 11/1992 | Sasagawa et al. | |
| 5,200,022 A | 4/1993 | Kong et al. .................... 156/612 |

(Continued)

FOREIGN PATENT DOCUMENTS
DE  4422660 A1  2/1995
(Continued)

OTHER PUBLICATIONS

Harle et al., Advanced Technologies for High Efficiency GaInN LEDs for Solid State Lighting, Third Intl. Conference on Solid State Lighting, Proc. of SPIE, vol. 5187, 2004.

(Continued)

*Primary Examiner* — Allan R Wilson
(74) *Attorney, Agent, or Firm* — Meyers Bigel Sibley & Sajovec, P.A.

(57) ABSTRACT

A light emitting diode is disclosed having a vertical orientation with an ohmic contact on portions of a top surface of the diode and a mirror layer adjacent the light emitting region of the diode. The diode includes an opening in the mirror layer beneath the geometric projection of the top ohmic contact through the diode that defines a non-contact area between the mirror layer and the light emitting region of the diode to encourage current flow to take place other than at the non-contact area to in turn decrease the number of light emitting recombinations beneath the ohmic contact and increase the number of light emitting recombinations in the more transparent portions of the diode.

19 Claims, 7 Drawing Sheets

U.S. PATENT DOCUMENTS

| | | | |
|---|---|---|---|
| 5,376,580 A | 12/1994 | Kish et al. | |
| RE34,861 E | 2/1995 | Davis et al. | 437/100 |
| 5,404,031 A | 4/1995 | Sasaki et al. | |
| 5,416,342 A | 5/1995 | Edmond et al. | |
| 5,429,954 A | 7/1995 | Gerner | |
| 5,502,316 A * | 3/1996 | Kish et al. | 257/94 |
| 5,565,694 A | 10/1996 | Huang et al. | 257/97 |
| 5,696,389 A | 12/1997 | Ishikawa et al. | |
| 5,703,436 A * | 12/1997 | Forrest et al. | 313/506 |
| 5,710,440 A | 1/1998 | Okagawa | |
| 5,719,891 A | 2/1998 | Jewell | 372/46.013 |
| 5,739,554 A | 4/1998 | Edmond et al. | |
| 5,779,924 A | 7/1998 | Krames et al. | |
| 5,789,768 A | 8/1998 | Lee et al. | 257/96 |
| 5,792,698 A | 8/1998 | Nishitani | |
| 5,814,839 A | 9/1998 | Hosoba | |
| 5,838,706 A | 11/1998 | Edmond et al. | |
| 5,912,477 A | 6/1999 | Negley | |
| 5,962,875 A * | 10/1999 | Motoki et al. | 257/103 |
| 5,985,687 A | 11/1999 | Bowers et al. | |
| 6,057,562 A | 5/2000 | Lee et al. | |
| 6,071,795 A | 6/2000 | Cheung et al. | |
| 6,100,104 A | 8/2000 | Haerle et al. | |
| 6,120,600 A * | 9/2000 | Edmond et al. | 117/89 |
| 6,133,589 A | 10/2000 | Krames et al. | |
| 6,169,296 B1 | 1/2001 | Kamiyama et al. | |
| 6,187,606 B1 | 2/2001 | Edmond et al. | |
| 6,194,743 B1 | 2/2001 | Kondoh et al. | |
| 6,201,262 B1 | 3/2001 | Edmond et al. | |
| 6,232,623 B1 | 5/2001 | Morita | 257/103 |
| 6,242,761 B1 | 6/2001 | Fujimoto et al. | |
| 6,258,618 B1 | 7/2001 | Lester | |
| 6,258,699 B1 | 7/2001 | Chang et al. | |
| 6,287,947 B1 | 9/2001 | Ludowise et al. | |
| 6,303,405 B1 | 10/2001 | Yoshida et al. | |
| 6,335,263 B1 | 1/2002 | Cheung et al. | |
| 6,365,429 B1 | 4/2002 | Kneissl et al. | |
| 6,373,077 B1 | 4/2002 | Edmond et al. | |
| 6,403,985 B1 | 6/2002 | Fan et al. | |
| 6,410,940 B1 | 6/2002 | Jiang et al. | |
| 6,410,942 B1 | 6/2002 | Thibeault et al. | 257/88 |
| 6,420,199 B1 | 7/2002 | Coman et al. | |
| 6,420,242 B1 | 7/2002 | Cheung et al. | |
| 6,420,732 B1 | 7/2002 | Kung et al. | 257/79 |
| 6,420,735 B2 | 7/2002 | Kim | |
| 6,448,102 B1 | 9/2002 | Kneissl et al. | |
| 6,455,343 B1 | 9/2002 | Chen et al. | 438/40 |
| 6,459,100 B1 | 10/2002 | Doverspike et al. | |
| 6,465,809 B1 | 10/2002 | Furukawa et al. | |
| 6,468,824 B2 | 10/2002 | Chen et al. | 438/46 |
| 6,469,324 B1 | 10/2002 | Wang | |
| 6,486,499 B1 | 11/2002 | Krames et al. | |
| 6,492,661 B1 | 12/2002 | Chien et al. | |
| 6,514,782 B1 | 2/2003 | Wierer, Jr. et al. | |
| 6,521,914 B2 | 2/2003 | Krames et al. | |
| 6,534,798 B1 | 3/2003 | Scherer et al. | |
| 6,559,075 B1 | 5/2003 | Kelly et al. | |
| 6,562,648 B1 | 5/2003 | Wong et al. | |
| 6,576,930 B2 | 6/2003 | Reeh et al. | 257/98 |
| 6,593,160 B2 | 7/2003 | Carter-Coman et al. | 438/26 |
| 6,607,931 B2 | 8/2003 | Streubel | |
| 6,610,551 B1 | 8/2003 | Doverspike et al. | |
| 6,635,503 B2 | 10/2003 | Andrews et al. | |
| 6,649,437 B1 | 11/2003 | Yang et al. | |
| 6,657,236 B1 | 12/2003 | Thibeault et al. | 257/98 |
| 6,664,560 B2 | 12/2003 | Emerson et al. | |
| 6,677,173 B2 | 1/2004 | Ota | |
| 6,716,654 B2 | 4/2004 | Hsu et al. | |
| 6,734,033 B2 | 5/2004 | Emerson et al. | |
| 6,740,604 B2 | 5/2004 | Kelly et al. | |
| 6,740,906 B2 | 5/2004 | Slater, Jr. et al. | |
| 6,744,071 B2 | 6/2004 | Sano et al. | 257/79 |
| 6,747,298 B2 | 6/2004 | Slater, Jr. et al. | |
| 6,757,314 B2 | 6/2004 | Kneissl et al. | |
| 6,786,390 B2 | 9/2004 | Yang et al. | |
| 6,791,119 B2 | 9/2004 | Slater et al. | |
| 6,794,690 B2 | 9/2004 | Uemura | |
| 6,800,500 B2 | 10/2004 | Coman et al. | |
| 6,800,876 B2 | 10/2004 | Edmond et al. | |
| 6,806,112 B1 | 10/2004 | Horng et al. | |
| 6,809,341 B2 | 10/2004 | Hsu et al. | |
| 6,812,502 B1 | 11/2004 | Chien et al. | |
| 6,815,312 B2 | 11/2004 | Furukawa et al. | |
| 6,821,804 B2 | 11/2004 | Thibeault et al. | |
| 6,825,501 B2 | 11/2004 | Edmond et al. | |
| 6,828,596 B2 | 12/2004 | Steigerwald et al. | |
| 6,831,302 B2 | 12/2004 | Erchak et al. | |
| 6,844,571 B2 | 1/2005 | Krames et al. | |
| 6,846,686 B2 | 1/2005 | Saeki et al. | |
| 6,849,878 B2 | 2/2005 | Bader et al. | |
| 6,900,472 B2 | 5/2005 | Kondoh et al. | |
| 6,903,376 B2 | 6/2005 | Shen et al. | |
| 6,987,613 B2 | 1/2006 | Pocius et al. | |
| 6,992,334 B1 | 1/2006 | Wierer, Jr. et al. | |
| 7,037,742 B2 | 5/2006 | Slater et al. | 438/39 |
| 7,042,150 B2 | 5/2006 | Yasuda | 313/498 |
| 7,135,709 B1 | 11/2006 | Wirth et al. | 257/95 |
| 7,145,181 B2 | 12/2006 | Wirth | |
| 7,148,520 B2 | 12/2006 | Yoo | |
| 7,166,870 B2 | 1/2007 | Erchak et al. | |
| 7,189,591 B2 | 3/2007 | Suehiro et al. | |
| 7,250,635 B2 | 7/2007 | Lee et al. | |
| 7,294,866 B2 | 11/2007 | Liu | 257/100 |
| 7,335,920 B2 | 2/2008 | Denbaars et al. | 257/79 |
| 7,442,966 B2 | 10/2008 | Bader et al. | 257/98 |
| 7,453,098 B2 | 11/2008 | Lai et al. | |
| 7,501,023 B2 | 3/2009 | Dmitriev et al. | |
| 7,514,720 B2 | 4/2009 | Kim et al. | |
| 7,601,942 B2 * | 10/2009 | Underwood et al. | 250/214.1 |
| 7,622,363 B2 * | 11/2009 | Yonehara et al. | 438/458 |
| 7,692,204 B2 * | 4/2010 | Stein et al. | 257/98 |
| 2002/0022290 A1 | 2/2002 | Kong et al. | |
| 2002/0068373 A1 | 6/2002 | Lo et al. | |
| 2002/0121642 A1 | 9/2002 | Doverspike et al. | |
| 2002/0123164 A1 | 9/2002 | Slater, Jr. et al. | |
| 2002/0163007 A1 | 11/2002 | Matsumoto et al. | |
| 2002/0197764 A1 | 12/2002 | Uemura et al. | |
| 2003/0015721 A1 | 1/2003 | Slater et al. | |
| 2003/0045015 A1 | 3/2003 | Slater et al. | |
| 2003/0132701 A1 | 7/2003 | Sato et al. | |
| 2003/0173602 A1 | 9/2003 | Hsu et al. | |
| 2003/0197169 A1 | 10/2003 | Lee et al. | |
| 2003/0197170 A1 | 10/2003 | Bader et al. | |
| 2004/0004226 A1 | 1/2004 | Eisert et al. | |
| 2004/0012027 A1 | 1/2004 | Keller et al. | |
| 2004/0016937 A1 * | 1/2004 | Kachi et al. | 257/98 |
| 2004/0033638 A1 | 2/2004 | Bader et al. | |
| 2004/0051118 A1 | 3/2004 | Bruhns et al. | |
| 2004/0062284 A1 | 4/2004 | Jewell | |
| 2004/0072382 A1 | 4/2004 | Kelly et al. | |
| 2004/0124429 A1 | 7/2004 | Stokes et al. | |
| 2004/0135158 A1 | 7/2004 | Hon | |
| 2004/0195641 A1 | 10/2004 | Wirth | |
| 2004/0232812 A1 | 11/2004 | Beeson et al. | |
| 2004/0262621 A1 | 12/2004 | Oh et al. | |
| 2005/0006669 A1 | 1/2005 | Mishra et al. | |
| 2005/0018725 A1 | 1/2005 | Nurmikko | |
| 2005/0019971 A1 | 1/2005 | Slater et al. | |
| 2005/0082544 A1 | 4/2005 | Narukawa et al. | |
| 2005/0082546 A1 | 4/2005 | Lee et al. | |
| 2005/0082562 A1 | 4/2005 | Ou et al. | |
| 2005/0169336 A1 | 8/2005 | Ishii et al. | |
| 2005/0184307 A1 | 8/2005 | Li et al. | |
| 2005/0211999 A1 | 9/2005 | Negley | |
| 2005/0224782 A1 | 10/2005 | Linga et al. | |
| 2005/0236636 A1 | 10/2005 | Hon et al. | |
| 2006/0054909 A1 | 3/2006 | Shin et al. | |
| 2006/0131558 A1 | 6/2006 | Sato et al. | |
| 2006/0214176 A1 * | 9/2006 | Ouchi et al. | 257/98 |
| 2006/0228820 A1 | 10/2006 | Kerdiles et al. | |
| 2009/0040588 A1 | 2/2009 | Tonar et al. | |

FOREIGN PATENT DOCUMENTS

| | | |
|---|---|---|
| DE | 1974723 A1 | 10/1998 |
| EP | 0 810 674 | 12/1997 |
| EP | 1 263 058 A | 12/2002 |
| EP | 1 416 543 A1 | 5/2004 |

| | | |
|---|---|---|
| GB | 2280061 A | 1/2006 |
| JP | 61059886 | 3/1986 |
| JP | 3283676 | 12/1991 |
| JP | 06029570 A | 4/1994 |
| JP | 06-291365 | 10/1994 |
| JP | 7022646 | 1/1995 |
| JP | 08-032108 A | 2/1996 |
| JP | 08-167738 | 6/1996 |
| JP | 8167738 | 6/1996 |
| JP | 08213649 A | 8/1996 |
| JP | 08288550 A | 11/1996 |
| JP | 09074221 A | 3/1997 |
| JP | 09-199278 | 7/1997 |
| JP | 09-266355 | 10/1997 |
| JP | 09-298342 | 11/1997 |
| JP | 10-114600 A | 5/1998 |
| JP | 11-074559 A | 3/1999 |
| JP | 11-186600 | 7/1999 |
| JP | 11186607 | 7/1999 |
| JP | 11238913 | 8/1999 |
| JP | 11251627 | 9/1999 |
| JP | 2000-228537 | 8/2000 |
| JP | 2000-228537 A | 8/2000 |
| JP | 2000261029 | 9/2000 |
| JP | 2003-017740 A | 1/2003 |
| JP | 200337285 | 2/2003 |
| JP | 2004-006893 A | 1/2004 |
| JP | 2004-047760 A | 2/2004 |
| JP | 04047760 A | 2/2004 |
| JP | 2004-511080 | 4/2004 |
| JP | 2004511080 A | 4/2004 |
| JP | 2004-521494 | 7/2004 |
| JP | 2004-524710 A | 8/2004 |
| JP | 2005557 | 1/2005 |
| WO | WO 01/41225 A2 | 6/2001 |
| WO | WO 0141225 A2 | 6/2001 |
| WO | WO02/061847 A2 | 8/2002 |
| WO | WO 02/089217 A2 | 11/2002 |

OTHER PUBLICATIONS

Koike et al., Development of High Efficency GaN-based Multiquantum-Well Light Emitting Diodes and their Applications, IEEE, vol. 8 No. 2, Mar.-Apr. 2002.
Kuo et al., Nitride-based Near-Ultraviolet LEDs with an ITO Transparent Contact, Materials Science and Engineering, vol. B106, pp. 69-72, 2004.
Gardner et al., High-Flux and High Efficiency Nitride-Based Light Emitting Diodes, IEEE, pp. 641-642, 2002.
Craford, M. George, Visible LEDs: The Trend Toward High Power Emitters and Remaining Challenges for Solid State Lighting, Solid State Lighting II, Proc. of SPIE, vol. 4776, 2002.
Niki et al., White LEDs for Solid State Lighting, Third International Conference on Solid State Lighting, Proc. of SPIE, vol. 5187, 2004.
Tadamoto et al., High Output Power Near-Ultraviolet and Violet Light-Emitting Diodes Fabricated on Patterned Sapphire Substrates Using Metalorganic Vapor Phase Epitaxy, Third Intl. Conference on Solid State Lighting, Proc. of SPIE, vol. 5187, 2004.
Mukai et al., Recent Progress of Nitride-Based Light Emitting Devices, Phys. Stat. Sol. vol. 200, No. 1, pp. 52-57, 2003.
Mukai et al., GaN-based Light-Emitting Diodes Suitable for White Light, Light Emitting Diodes: Research, Manufacturing, and Applications VII, Proc. of SPIE, vol. 4996, 2003.
Morita et al., Over 200 mW on 365 nm Ultraviolet Light Emitting Diode of GaN-free Structure, Phys. Stat. Sol., vol. 200, No. 1, pp. 114-117, 2003.
United Epitaxy Company, Ltd., Specifications Confirmation Letter, 4713DC AlInGaN Blue LED Chip, 2003.
Epitech Technology Corporation, Traffic Green LED Chip, Dec. 2003.
Seoul Semiconductor Co. Ltd., AlInGaN LED Dice, 2003.
Epitech Technology Corporation, Near Blue LED Chip, Dec. 2003.
Unity Opto Technology Co., Ltd., AlGaAs/GaAs High Power T-1 3/4 Package Infrared Emitting Diode, Nov. 17, 2000.
Nichia Corporation, White LED Analysis, Mar. 17, 2004.

International Search Report of foreign counterpart application No. PCT/US2005/032894 mailed May 24, 2006, 3 pages.
Bulman, G.E., et al ; "Nitride Lasers on SiC Substrates," Lasers and Electro-Optics Annual Meeting, ISBN 0-7803-4947-4, IEEE, Dec. 1, 1998, vol. 2, pp. 348-349.
Windisch R, et al; "40% Efficient Thin-Film Surface-Textured Light-Emitting Dios by Optimization of Natural Lithography," IEEE Transactions on Electron Devices, ISSN: 0018-9383, vol. 47 No. 7, Jul. 2000, pp. 1492-1498.
Nakamura S, et al; "Superbright Green Ingan Single-Quantum-Well-Structure Light-Emitting Diodes," Japanese Journal of Applied Physics, ISSN: 0021-4922, vol. 34., No. 10B, Part 2, Oct. 15, 1995, pp. L1332-L1335.
Office Action from related U.S. Appl. No. 11/082,470, dated: Jan. 14, 2010.
Office Action from related Korean Application No. 10-2007-7006475, received: Dec. 31, 2009.
Office Action from U.S. Appl. No. 12/401,843, dated: Nov. 12, 2009.
Preliminary Amendment from U.S. Appl. No. 12/401,843, dated: Nov. 24, 2009.
Reply to Office Action from U.S. Appl. No. 12/401,843, dated: Mar. 12, 2010.
Office Action from U.S. Appl. No. 11/082,470, dated: Jul. 11, 2007.
Response to Office Action from U.S. Appl. No. 11/082,470, dated: Sep. 28, 2007.
Office Action from U.S. Appl. No. 11/082,470, dated: Dec. 7, 2007.
Response to Office Action from U.S. Appl. No. 11/082,470, dated: Feb. 14, 2008.
Office Action from U.S. Appl. No. 11/082,470, dated: May 15, 2008.
Appeal Brief from U.S. Appl. No. 11/082,470, dated: Jan. 22, 2009.
Revised Appeal Brief from U.S. Appl. No. 11/082,470, dated: Apr. 29, 2009.
Office Action from U.S. Appl. No. 11/082,470, dated: Jun. 22, 2009.
Response to Office Action from U.S. Appl. No. 11/082,470, dated: Aug. 24, 2009.
Supplemental Amendment to Office Action from U.S. Appl. No. 11/082,470, dated: Aug. 27, 2009.
Response to Office Action from U.S. Appl. No. 11/082,470, dated: Dec. 22, 2009.
Response to Office Action from U.S. Appl. No. 11/082,470, dated: Apr. 9, 2010.
Office Action for counterpart Japanese Patent Application No. 2007-533544 dated May 27, 2010.
Office Action from counterpart Korean Patent Application No. 10-2008-7027784 mailed Jun. 14, 2010.
Office Action from counterpart Korean Patent Application No. 10-2007-7006475 mailed Jul. 21, 2010.
Official Notice of Rejection from Japanese Patent Application No. 2007-552114, Appeal No. 2009-9446, mailed Jun. 29, 2010.
Schnitzer et al. *30% External Quantum Efficiency From Surface Textured, Thin-Film Light-Emitting Diodes*, Appl. Phys. Letters 63(16), Oct. 18, 1993, American Institute of Physics, pp. 2174-2176.
Streubel et al. *High Brightness Algainp Light-Emitting Diodes*, IEEE Journal on Selected Topics in Quantum Electronics, vol. 8, No. 2, Mar./Apr. 2002.pp. 321-332.
Windisch et al. *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.
Windisch et al. *Impact of Texture-Enhanced Transmission on High-Efficiency Surface-Textured Light-Emitting Diodes*, Applied Physics Letters, vol. 79, No. 15, Oct. 8, 2001, pp. 2315-2317.
Patent Abstracts of Japan Publication No. 01295469, Publication Date: Nov. 29, 1989 Hitachi Cable Ltd.
Patent Abstracts of Japan Publication No. 08167738, Publication Date: Jun. 25, 1996 Sanken Electric Co Ltd.
Patent Abstracts of Japan Publication No. 08213649, Publication Date: Aug. 20, 1996, Sanken EL4ECTRIC Co Ltd.
Patent Abstracts FO Japan Publication No. 08288550, Publication Date: Nov. 1, 1996, Sanken Electric Co Ltd.
Patent Abstracts of Japan Publication No. 2004047760, Publication Date: Feb. 12, 2004, Hitachi Cable Ltd.

Patent Abstracts of Japan Publication No. 06029570, Publication Date: Feb. 4, 1994, Mitsubishi Cable Ind Ltd.
Patent Abstracts of Japan Publication No. 09074221, Publication Date: Mar. 18, 1997, Hosobane Hiroyuki.
Official Notice of Final Decision of Rejection of related Japanese Patent Application No. 2007-552114, dated: Jan. 30, 2009.
PCT International Preliminary Report PCT/US05/36552, Dated: Mar. 31, 2008.
Official Communication from European Application No. 05806491.6, dated: Sep. 8, 2009.
Examination Report dated May 6, 2008, from European Application No. 05 806 491.6-222.
Official Communication for European Application No. 05806491.6, dated: Apr. 19, 2010.
Japanese Official Notice of Rejection mailed on Jul. 18, 2008, Japanese Patent Application No. 2007-552114.
Patent Abstracts of Japan Publication No. 11-251627, Date: Sep. 17, 1999.
Patent Abstracts of Japan Publication No. 11-186607, Date: Jul. 9, 1999.
Patent Abstracts of Japan Publication No. 2005-005557 Date: Jan. 6, 2005.
Patent Abstracts of Japan Publication No. 2003-037285 Date: Feb. 7, 2003.
Patent Abstracts of Japan Publication No. 2000-261029 Date: Sep. 22, 2000.
U.S. Appl. No. 11/042,030, LED With Current Confinement Structure and Surface Roughening filed Jan. 24, 2005.
U.S. Appl. No. 11/983,616, LED With Current Confinement Structure and Surface Roughening, filed Nov. 9, 2007.
U.S. Appl. No. 12/079,486, LED With Current Confinement Structure and Surface Roughening, filed Mar. 25, 2008.
U.S. Appl. No. 12/581,759, LED With Current Confinement Structure and Surface Roughening, filed Oct. 19, 2009.
European Search Report for Patent Application No. 10181491.1 dated Jan. 26, 2011.
Final Office Action for Japanese Patent Application No. 2007-552114 dated Nov. 25, 2010.
Intersil, Reliability Engineering, web cite: http://rel.intersil.com/docs/lexicon/S.Html, viewed Aug. 24, 2010 (no publication date given), pp. 1-6.
Office Action for counterpart European Patent Application No. 05797533.6 dated Dec. 27, 2010.
European Search Report for European Patent Application No. 10181491.1 dated Feb. 23, 2011.
Haerle et al. "High brightness LEDs for general lighting applications Using the new ThinGaN™-Technology" *phys. stat. sol. (a)* 201(12):2736-2739 (Sep. 2004).
Tadatomo et al. "High output power near-ultraviolet and violet light-emitting diodes fabricated on patterned sapphire substrates using metalorganic vapor phase epitaxy" *Proc. of SPIE* 5187:243-249 (Jan. 2004).
Thibeault et al. "Enhanced Light Extraction Through Integrated Microlens Arrays and Dispersive Elements", U.S. Appl. No. 60/168,817, filed Dec. 3, 1999.

\* cited by examiner

HIGH EFFICIENCY GROUP III NITRIDE LED WITH LENTICULAR SURFACE

This application is a divisional of Ser. No. 11/082,470 filed Mar. 17, 2005 for "High Efficiency Group III Nitride LED with Lenticular Surface." No. 11/082,470 is a continuation-in-part of Ser. No. 10/951,042 filed Sep. 22, 2004 for "High Efficiency Group III Nitride Silicon Carbide Light Emitting Diode," and now U.S. Pat. No. 7,259,402, the contents of which are incorporated entirely herein by reference.

BACKGROUND

The present invention relates to light emitting diodes ("LEDs") and in particular relates to high-brightness light emitting diodes formed from Group III nitride active structures on silicon carbide substrates.

This application is also related to the following copending and commonly assigned U.S. applications: Ser. No. 10/811,350 filed on Mar. 26, 2004 for, "Etching of Substrates of Light Emitting Devices," and now U.S. Pat. No. 7,202,181; Ser. No. 60/591,353. filed on Jul. 27, 2004 for, "Ultra-Thin Ohmic Contacts for P-Type Nitride Light Emitting Devices," and now published as No. 20060046328; and Ser. No. 60/639,705 filed Dec. 28, 2004 for, "Ultra-Thin Ohmic Contacts for P-Type Nitride Light Emitting Devices," now published as No. 20060046328. The contents of each of these are incorporated entirely herein by reference.

The semiconductor era has witnessed the replacement of many types of electrical devices with solid state counterparts. The most obvious is perhaps the replacement of the vacuum tube (almost unknown to present younger generations) with the transistor. Solid state devices, because of their nature and operation, are inherently much more reliable than earlier generations of electronic devices and can have significantly longer lifetimes, typically by a factor of at least 100. In comparison to such mature technologies, solid-state devices are longer-lasting, physically more rugged, use less power, and are more efficient.

A light emitting diode (LED) is a p-n junction semiconductor diode that emits light when current is injected across a p-n junction (forward biased) to drive the recombination of electrons and holes with the concurrent production of photons. Thus, light emitting diodes produce light based upon the movement of electrons in a semiconductor material. Therefore, LEDs do not require (although they can be used in conjunction with) vapors or phosphors. They share the desirable characteristics of most semiconductor-based devices, including high efficiency (their emissions comparatively little heat), high reliability and long life. For example, typical LEDs have a mean time between failures of between about 100,000 and 1,000,000 hours meaning that a conservative half lifetime for an LED is on the order of 50,000 hours.

An LED's emitted light has a frequency (which in turn relates directly to wavelength and color in accordance with well-understood principles of physics) based upon the energy difference between permitted energy levels in the material, a characteristic referred to as the bandgap. The bandgap is a fundamental property of the semiconductor material and its doping. For example, gallium arsenide phosphide (GaAsP) represents a well-established material system for light emitting diodes. Depending on the mole fraction of Ga and As, these materials have a bandgap of between about 1.42 and 1.98 electron volts (eV), and will emit light in the infrared, red and orange portions of the electromagnetic spectrum.

In order to further commercialize light emitting diode applications, however, colors other than red, orange and yellow must be available. Specifically blue and green light emitting diodes are required (along with red diodes) to create white light or full color displays. Because these colors represent higher-energy portions of the visible spectrum, they require larger transitions than the bandgaps of silicon or gallium arsenide can provide.

In turn, because green, blue, and ultraviolet (UV) photons represent higher frequency colors (E=hυ) within (and beyond) the visible spectrum, they can only be produced by LEDs with bandgaps of at least about 2.2 eV. Such materials include diamond (5.47 eV), silicon carbide (2.99 eV) and Group III nitrides such as GaN (3.4 eV). In addition to producing green, blue or ultraviolet light per se, wide bandgap LEDs can be combined with red and green LEDs to produce white light, or with phosphors that produce white light when excited by blue or UV light, or both.

For several reasons, the Group III nitride compositions (i.e., Group III of the periodic table), particularly GaN, AlGaN, InGaN and AlInGaN are particularly useful for LEDs that emit in the ultraviolet (UV) through green portions of the spectrum. As one advantage, they are "direct" bandgap materials, meaning that when an electron transition occurs across the bandgap, much of the energy is emitted as light. By comparison, "indirect" materials (such as silicon carbide) emit their energy partially as light (a photon) and predominantly as vibrational energy (a phonon). Thus Group III nitrides offer efficiency advantages over indirect transition materials.

As another advantage, the bandgap of ternary and quaternary Group III materials (e.g., AlGaN, InGaN, AlInGaN) depends upon the atomic fraction of the included Group III elements. Thus the wavelength (color) of the emission can be tailored (within limits) by controlling the atomic fraction of each Group III element in a ternary or quaternary nitride.

Wide bandgap semiconductors have been, however, historically more difficult to produce and work with than gallium-arsenide or gallium phosphide (GaP). As a result, blue and UV-emitting LEDs have lagged behind GaP-based LED's in their commercial appearance. For example, silicon carbide is physically very hard, has no melt phase, and requires high temperatures (on the order of about 1500-2000° C.) for epitaxial or sublimation growth. The Group III nitrides have relatively large nitrogen vapor pressures at their melting temperatures and thus are likewise difficult or impossible to grow from a melt. Additionally, difficulties in obtaining p-type gallium nitride (and other Group III nitrides) remained a barrier to diode production for a number of years. Accordingly, the commercial availability of blue and white-emitting LEDs is more recent than the corresponding availability of GaP-based and GaAs-based LEDs.

A number of commonly assigned patents and co-pending patent applications likewise discuss the theory and nature of light emitting diodes, including but not limited to U.S. Pat. Nos. 6,459,100; 6,373,077; 6,201,262; 6,187,606; 5,912,477; 5,416,342; and 5,838,706; and Published U.S. Applications Nos. 20020022290; 20020093020; and 20020123164. The contents of these are incorporated entirely herein by reference.

Blue LEDs and their related derivative devices are becoming more frequently included in consumer electronic devices, particularly small displays. Common examples include items such as computer screens, personal digital assistants ("PDAs") and cellular phones. In turn, these small devices drive demand for thinner LEDs with reduced area ("footprint"). Such LEDs, however, must still operate at low forward voltages ($V_f$) and high light output. To date, however, reducing the size of the Group III nitride devices has tended to increase their forward voltage and reduce their radiant flux.

In addition to providing blue, green, or white light (as well as emissions in the ultraviolet range), the Group III nitride light emitting diodes have the potential to provide replacement for long-standing illumination technologies such as incandescent and fluorescent lighting. Historically, however, LEDs have lacked brightness comparable to incandescent, fluorescent or vapor-discharge lights and thus these older technologies have continued to occupy the field. Only recently, have white LEDs (or LED-based white-emitting devices) begun to make inroads into commercial lighting applications, with most of these being in smaller applications such as flashlights and related items.

In commercial embodiments of light emitting diodes (e.g., the XBRIGHT™ diodes offered by the assignee herein; Cree, Inc.; Durham, N.C.) recent advances have included an inverted device design. U.S. Pat. No. 6,740,906 discusses aspects of this design as does U.S. Patent Application Publication No. 20020123164. The contents of both of these are incorporated entirely herein by reference. In this type of design, the Group III active layers are grown (typically epitaxially) on a silicon carbide substrate. Light emitting diodes of this type are then mounted with their epitaxial layers ("epilayers") "down" rather than "up"; i.e., the silicon carbide portions form the display face of the mounted device. In this orientation the epitaxial layers are mounted to and face a circuit or "lead frame" that provides the electrical connection to the diode. The silicon carbide-up orientation increases light extraction from the device as set forth in the '906 patent and the '164 publication.

Silicon carbide can also be conductively doped. This provides advantages in comparison to sapphire based Group III nitride diodes. Because sapphire is an insulator, two top wire bonds are typically required to mount a working sapphire-based diode. In comparison, silicon carbide devices can be "vertically" oriented; i.e., with ohmic contacts on opposite ends of the device. Such vertical orientation is directly analogous to diodes formed in other conductive semiconductor materials such as gallium arsenide (GaAs), and thus the same mounting orientations and techniques can be used.

Although these "inverted" devices have successfully provided significant practical and commercial improvements, their "epilayer-down" orientation requires different, and to some extent more sophisticated, mounting on lead frames. In particular, because the active portion (p-n junction, multiple quantum well, etc.) is positioned closely adjacent to the lead frame, avoiding short circuits or other undesired interactions between the active portion and lead frame becomes more difficult.

For example, conventional LEDs (including Group III nitride on SiC devices) are often mounted on the lead frame using conductive silver epoxy. Silver epoxy is a mixture of more than about 50 percent by weight of microscopic silver particles with epoxy resin precursors. When used to connect electronic devices to circuits (or circuit boards) the silver epoxy provides flexibility, relative ease of handling, conductivity and good heat transfer properties. Because silver epoxy is (purposely) applied as a viscous liquid, it can and will flow accordingly and, unless other steps are taken, will tend to surround lower portions of any diode mounted with it. As noted above, if the active portions are adjacent the lead frame, the flowing silver epoxy can contact the active portion and cause short circuiting or other undesired interactions.

As a result, many conventional light emitting diode mounting techniques are either too difficult, too unreliable or simply unavailable for inverted Group III nitride silicon carbide devices. Other specific techniques (e.g., copending application Ser. No. 10/840,463 filed May 5, 2004 should or must be incorporated to avoid these problems.

As another potential solution, the inverted device can be positioned on some sort of sub-structure, with the sub-structure being attached to the lead frame. Examples include U.S. Patent Application Publication No. 20030213965. The sub-structure is included to add sufficient thickness to remove the active portions farther from the lead frame and its silver epoxy or related materials. As set forth in No. 20030213965, however, soldering the device to a substructure can undesirably tilt the device with respect to the sub-structure and thereby exacerbate the short-circuiting problem.

Accordingly, it remains a continuing goal to increase the current capacity, light output (power) and light extraction (geometry) capabilities of inverted light emitting diodes while concurrently reducing their size and particularly reducing their thickness. It remains a similar goal to produce such diodes in designs that can be conveniently incorporated into lead frames, packages and circuits in a manner similar or identical to related diodes.

SUMMARY

In one aspect the invention is a high efficiency Group III nitride light emitting diode that includes a substrate selected from the group consisting of semiconducting and conducting materials, a Group III nitride-based light emitting region on the substrate; and a lenticular surface containing single crystal silicon carbide on the light emitting region.

In another aspect the invention is a high efficiency Group III nitride light emitting diode that includes a conductive silicon carbide substrate; an aluminum indium gallium nitride light emitting region on the substrate, and a thin lenticular surface of silicon carbide on the light emitting region.

In another aspect, the invention is a high efficiency Group III nitride light emitting diode that includes a substrate selected from the group consisting of conducting and semi-conducting materials, at least one metal bonding layer on one surface of the substrate, an ohmic contact to the opposite surface of the substrate from the metal layer, a light emitting structure based upon the Group III nitride system on the at least one metal layer on the substrate, an ohmic contact on the light emitting structure opposite the substrate, and a lenticular surface, at least portions of which are formed of silicon carbide, on the portions of the light emitting structure other than the ohmic contact.

In another aspect, the invention is a high efficiency Group III nitride light emitting diode that includes a silicon carbide substrate, a backside ohmic contact on one surface of the substrate for providing one electrical connection to the diode, a metal bonding layer on the opposite surface of the substrate for providing a physical and electronic transition between the substrate and other portions of the diode, a mirror layer on the metal bonding layer for enhancing light extraction from the diode, a p-type Group III nitride layer on the mirror, a light emitting Group III nitride layer on the p-type layer and having a bandgap smaller than the bandgap of the p-type layer, an n-type Group III nitride layer on the light emitting layer and having a bandgap larger than the bandgap of the light emitting layer, a wire bond pad ohmic contact to the n-type layer for providing a second electrical connection to the diode, and a lenticular surface, at least portions of which are formed of silicon carbide, on the portions of the n-type layer other than the wire bond pad.

In another aspect, the invention is a high-efficiency Group III nitride light emitting diode package that includes a lead frame, and a light emitting diode on the lead frame, the diode including, a substrate selected from the group consisting of semiconducting and conducting materials, a Group III nitride based light emitting region on the substrate, a lenticular surface containing single crystal silicon carbide on the light emitting region, an ohmic contact between the substrate and the lead frame, and an ohmic contact to the light emitting region.

In another aspect, the invention is a wafer structure for high efficiency Group III nitride light emitting diode precursors that includes a conductive silicon carbide substrate wafer, a Group III nitride epitaxial layer on the substrate, a plurality of discrete ohmic contacts on the surface of the Group III nitride epitaxial layer, the ohmic contacts defining a plurality of discrete light emitting diode precursors, and a lenticular surface containing single crystals silicon carbide on the Group III nitride epitaxial layer.

The foregoing and other objects and advantages of the invention and the manner in which the same are accomplished will become clearer based on the followed detailed description taken in conjunction with the accompanying drawings.

DETAILED DESCRIPTION

Figure 1:
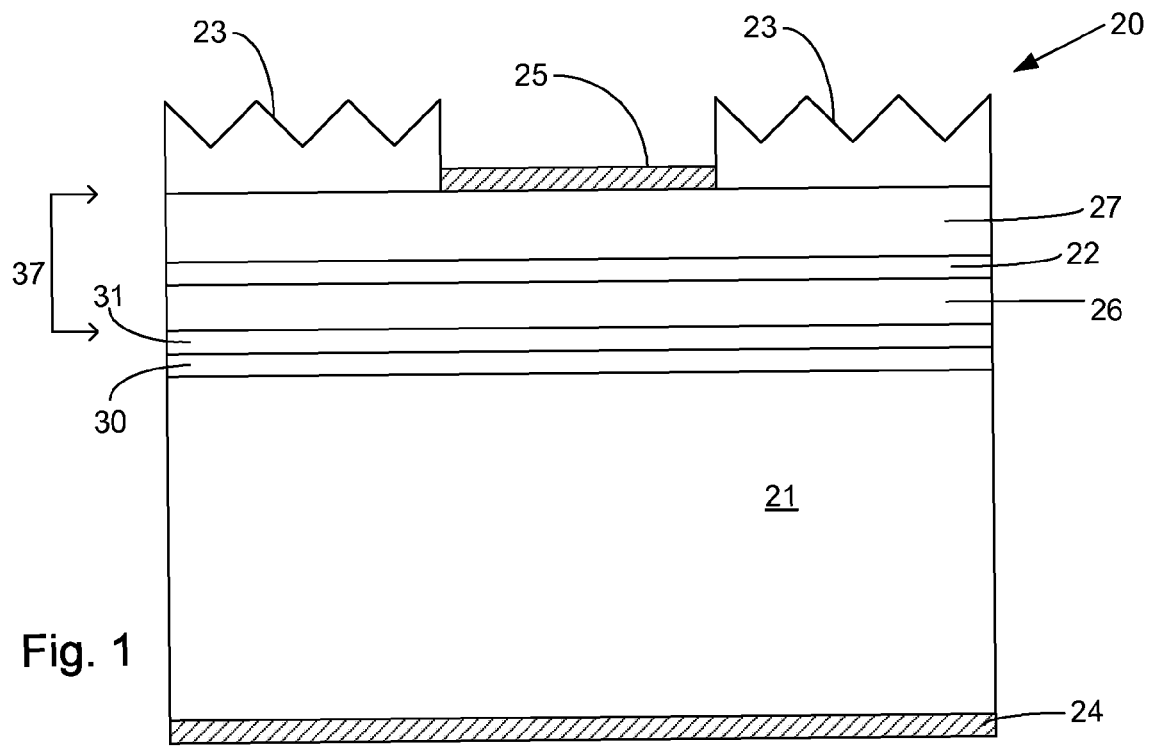
FIG. 1 is a cross sectional schematic illustration of a diode according to the present invention.

In a first aspect, the invention is a high efficiency Group III nitride light emitting diode. FIG. 1 is a schematic illustration taken in cross section of a diode according to the present invention with the diode broadly designated at 20. The diode includes a substrate 21 selected from the group consisting of semiconducting and conducting substrates, a Group III nitride based light emitting layer 22 on or above the substrate 21, and a lenticular surface 23 that contains silicon carbide on or above the light emitting layer 22. These Group III nitride layers together define a light emitting region 37.

In most embodiments, the silicon carbide of the lenticular surface 23 is single crystal. It will be understood by those familiar with silicon carbide and crystal structure that the descriptive term "single crystal" refers to the silicon carbide material and is entirely consistent with the lenticular surfaces described herein that obviously include a number of individual structures, each of which is formed of single crystal silicon carbide. The substrate can likewise be single crystal silicon carbide, but can also be selected from other materials such as silicon (Si), gallium arsenide (GaAs) or copper-tungsten (Cu—W)

As used in the context of the invention, the description of layers of materials "on" one another can refer to either layers that are above one another (with something in between) and layers that are directly in contact with one another. Each meaning will be clear in context, particularly to those persons of ordinary skill in this art.

As further illustrated in FIG. 1, the diode includes respective ohmic contacts 24 to the substrate 21 and 25 to the light emitting region 37 or to the epitaxial layer 27. As is typical in many diodes of this type, the backside ohmic contact 24 is relatively large for the purpose of encouraging current flow through the diode 20 while the ohmic contact 25 to the light emitting region 37 is typically smaller and in the form of a wire bond pad for minimizing the degree to which the ohmic contact 25 blocks light from leaving the diode.

FIG. 1 also illustrates that in several embodiments, the diode will include both p-type and n-type layers of Group III nitride for current injection across the p-n injunction and encouraging the recombination of carriers in the light emitting layer 22. FIG. 1 illustrates such layers as an n-type layer 27 and a p-type layer 26. Accordingly, FIG. 1 shows three Group III nitride layers (22, 26, 27) but in some embodiments (not illustrated) only one p-type layer and one n-type layer are included.

Thus, in embodiments for which FIG. 1 is illustrative, the preferred Group III nitride material is aluminum indium gallium nitride ($Al_xIn_yGa_{1-x-y}N$ where $0 \leq x$, $y \leq 1$ and $x+y \leq 1$) and the atomic fractions of aluminum, indium and gallium in each layer are selected so that light emitting layer 22 has a bandgap smaller than either of the adjacent layers 26 or 27.

The adjustment of the atomic fractions (i.e., x and y) of the Group III elements to obtain the desired bandgap is well understood in this art and can be carried out without undue experimentation. In addition to selecting the atomic fractions on the basis of the desired bandgap, other factors are typically considered such as crystal structure, stability, and the desired or necessary manufacturing steps.

The lenticular features described and claimed herein can be formed using at least the techniques set forth in copending and commonly-assigned application Ser. No. 10/815,293 filed Apr. 1, 2004 for, "Laser Patterning of Light Emitting Devices and Patterned Light Emitting Devices," and now U.S. Pat. No. 7,419,912, the contents of which are incorporated entirely herein by reference. Other techniques will be apparent to those of ordinary skill in this art.

In preferred embodiments, the substrate 21 is formed of single crystal silicon carbide (SiC) and is formed of one of the 3C, 4H, 6H and 15R polytypes of silicon carbide. Although the invention is not limited to these polytypes, they have favorable characteristics of thermal expansion and thermal conductivity.

The substrate 21 can also be a sub-mounting structure as set forth in commonly assigned U.S. Pat. No. 7,259,402. In either case (silicon carbide substrate or sub-mounting structure substrate), a metal bonding layer 30 can be favorably incorporated, typically for the purpose of manufacturing steps as set forth in the above U.S. Pat. No. 7,259,402. The metal layer 30 preferably includes a metal that forms a higher-temperature bond (e.g. above about 260° C.) which is helpful (or in some cases necessary) for lead-free assembly processes. In presently preferred embodiments the metal layer 30 uses gold (Au) and tin (Sn) either as a eutectic blend or as individual layers.

As further set forth in the U.S. Pat. No. 7,259,402, the diode 20 can also include a mirror layer 31 for enhancing the light extraction from the emitting layer 22. The mirror and the metal bonding layer can be selected of any appropriate metals provided they are conductive and otherwise consistent (do not interfere) with the structure and function of the remainder of the diode 20 and its elements. As set forth in the incorporated references, if the mirror is made of silver (Ag), additional structural layers of metal may be optionally included to prevent migration of silver into adjacent layers while still taking advantage of its reflective properties. Such barrier layers are typically (but not exclusively) formed of a titanium-tungsten (TiW) alloy, a nitride of the TiW alloy, or as a composite of TiW and platinum (Pt).

Figure 2:
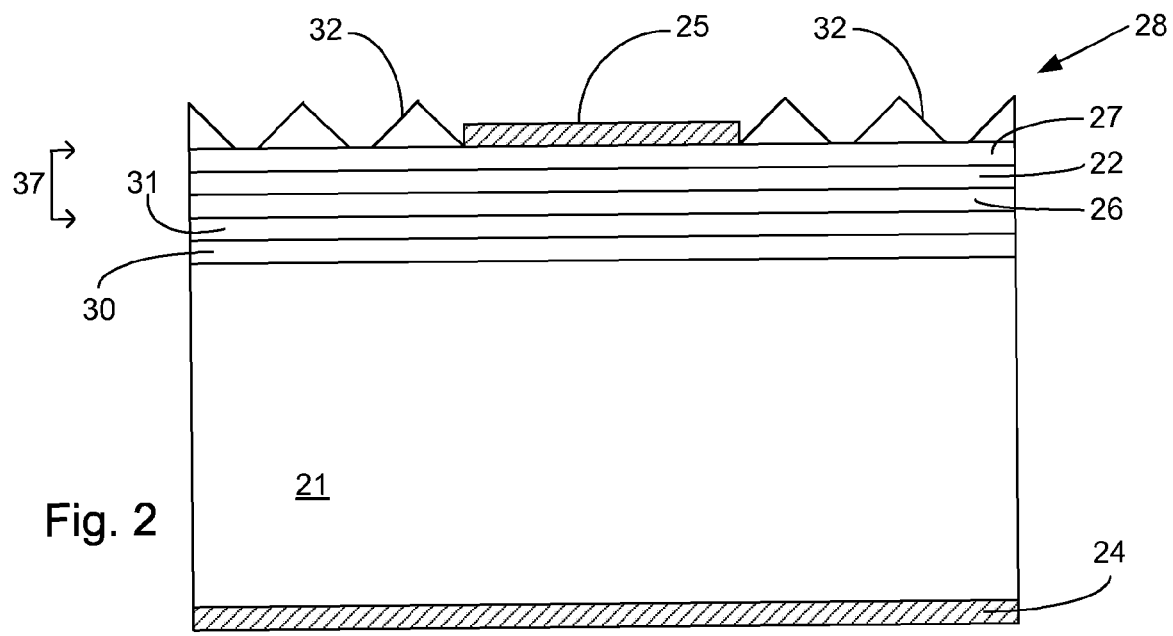
FIG. 2 is a cross sectional schematic illustration of a second embodiment of a diode according to the present invention.

FIG. 2 illustrates another embodiment of the diode broadly designated at 28. Many of the elements of FIG. 2 are identical to those in FIG. 1 and thus they retain the same reference numerals and will not be re-described herein. As FIG. 2 particularly indicates, however, the lenticular surface, now designated at 32, extends to, but not beyond, the light emitting region 37.

Thus, in FIG. 2 the lenticular surface 32 is illustrated as upon the n-type Group III nitride layer 27 rather than directly on the light emitting layer 22. Stated differently, in FIG. 1 the lenticular silicon carbide surface 23 includes at least some non-lenticular silicon carbide between the lenticular features and the remainder of the diode 20. In FIG. 2, the lenticular features are immediately upon the remainder of the diode with no silicon carbide in between. In either embodiment (FIG. 1 or FIG. 2) the lenticular features 23, 32 can be directly adjacent one another or they can be spaced from one another with non-lenticular portions therebetween.

Figure 3:
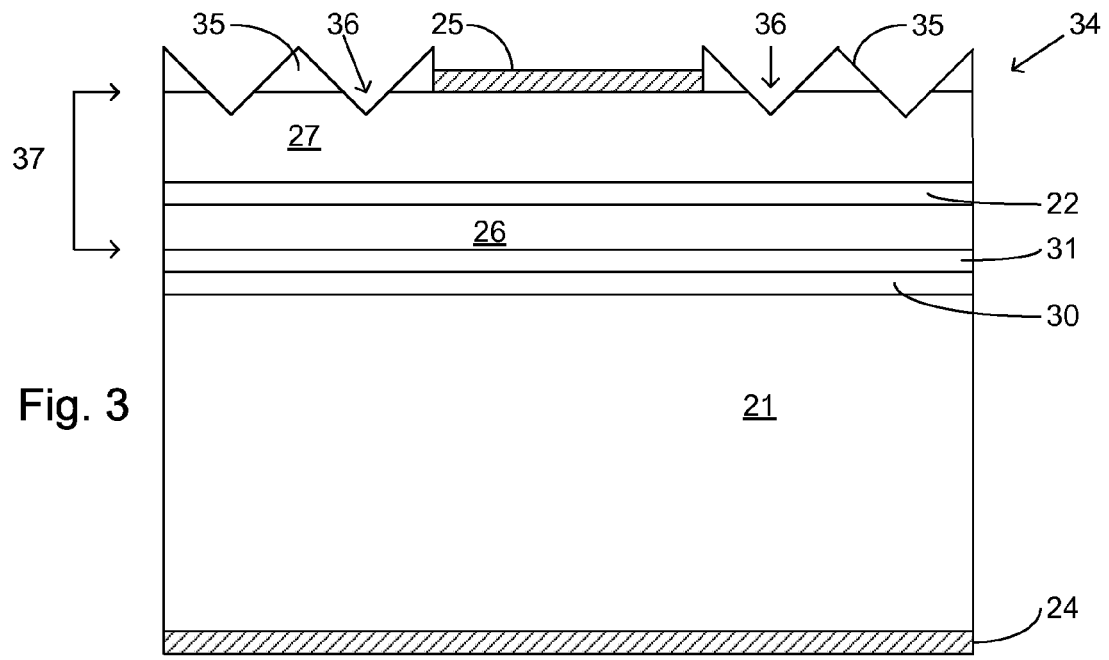
FIG. 3 is a cross-sectional schematic illustration of a third embodiment of a diode according to the present invention.

FIG. 3 illustrates yet another embodiment of the diode broadly designated at 34. Once again, elements common to FIGS. 1 and 2 carry the same reference numerals. As a further explanation and illustration, in all of the embodiments, the layers that together make up the light emitting region, regardless of the number of layers, can be broadly considered as a unit which is labeled at 37 in FIG. 3. Thus, in FIGS. 1-4 herein, a light emitting layer is designated at 22 while a light emitting region (which includes the emitting layer 22) is designated at 37. Those familiar with light emitting structures will recognize that the light emitting region can be as simple as a p-n junction, or can be formed of a few layers (as illustrated), or of more complex structures such as superlattices and multiple quantum wells.

In FIG. 3, however, the lenticular features are defined both by silicon carbide portions 35 and by features designated at 36 that extend into the remainder of the diode 34. In particular, in the embodiment illustrated in FIG. 3 the lenticular features 35 and 36 extend into the light emitting region 37, and because in this embodiment the diode 34 includes the n-type epitaxial layer 27, the features 36 extend into such layer 27.

Figure 4:
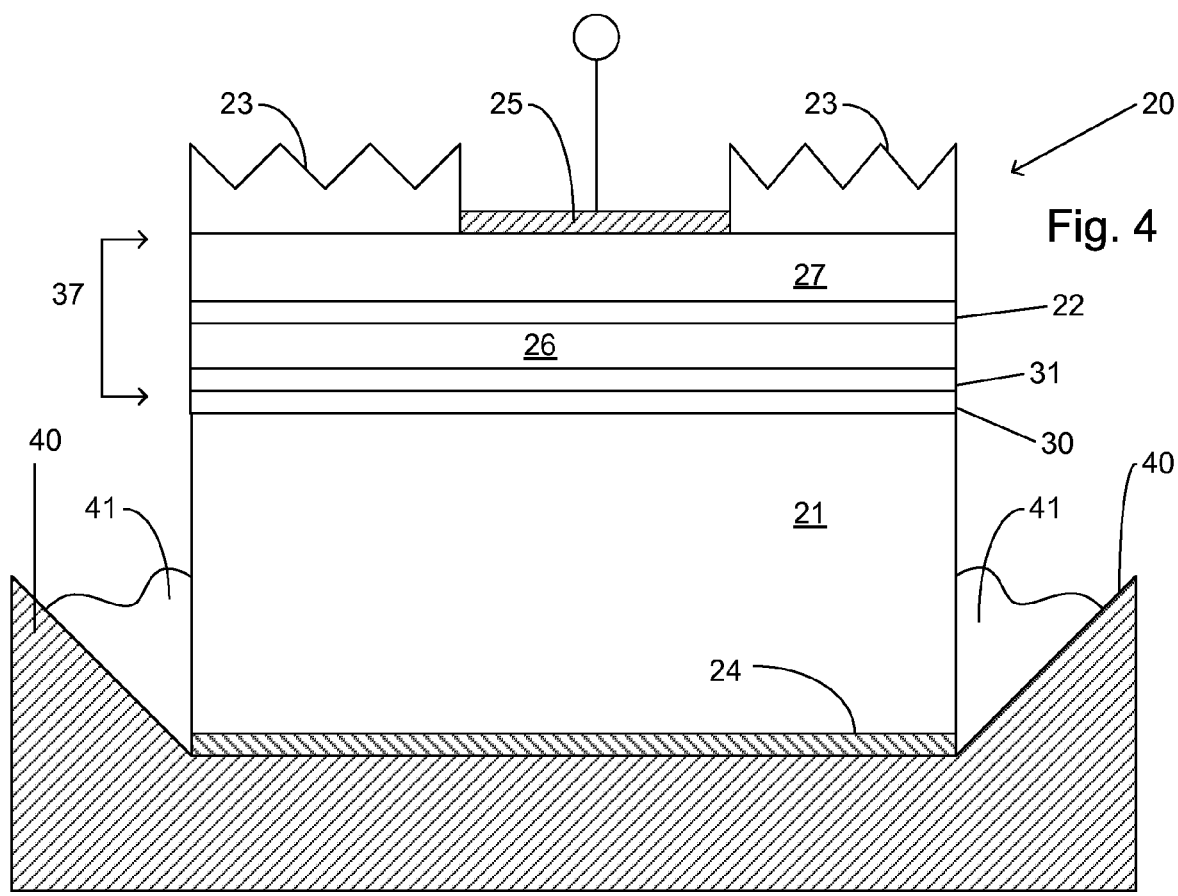
FIG. 4 is a schematic cross-sectional illustration of a diode and a lead frame in accordance with the present invention.

FIG. 4 is another cross-sectional schematic diagram of the diode 20 from FIG. 1 positioned on a lead frame 40. Because the diode 20 in FIG. 4 is identical to the diode 20 of FIG. 1, all of the elements carry the same reference numerals. It will be further understood that FIG. 4 is not drawn to scale, but rather for schematic illustration purposes. As illustrated in FIG. 4, the ohmic contact 24 is positioned between the substrate 21 and the lead frame 40 for providing an appropriate electrical contact between the lead frame 40 and the diode 20. As in many manufacturing techniques for mounting and packaging light emitting diodes, a conductive paste 41 helps attach the diode 20 to the lead frame. As illustrated in FIG. 4 and as set forth in U.S. Pat. No. 7,259,402, the substrate is of sufficient thickness to prevent the conductive paste 40 from touching (and thus electrically shorting) the Group III nitride region 37 or the light emitting layer 22.

Furthermore, although FIG. 4 illustrates the diode 20 in relatively large proportional context, it preferably incorporates the structural advantages set forth in co-pending application Ser. No. 10/951,042 to create a total thickness between and including the ohmic contacts 24 and 25 of no more than 150 microns. It will also be understood in this context that the wire bond pad ohmic contact 25 is shown as being positioned lower than the top of the lenticular surface 23. In such cases, the diode 20 would have a thickness no more than 150 microns inclusive of the backside ohmic contact 24 and the lenticular features 23.

It will be understood that FIGS. 1 through 4 are schematic rather than limiting of the diodes according to the claimed invention. For example, those familiar with diodes of this type will recognize that portions of the diodes, often including the light emitting region, are formed as mesas rather than with entirely vertical sides illustrated in FIGS. 1-4. Additionally, the illustrated structures or related mesa structures can typically include passivation layers for various well-understood purposes. Because the nature of the invention is such that it can be incorporated with or without mesa structures and with or without supplementary passivation, these alternative structures have not been specifically illustrated, but fall within the scope of the claims.

Figure 5:
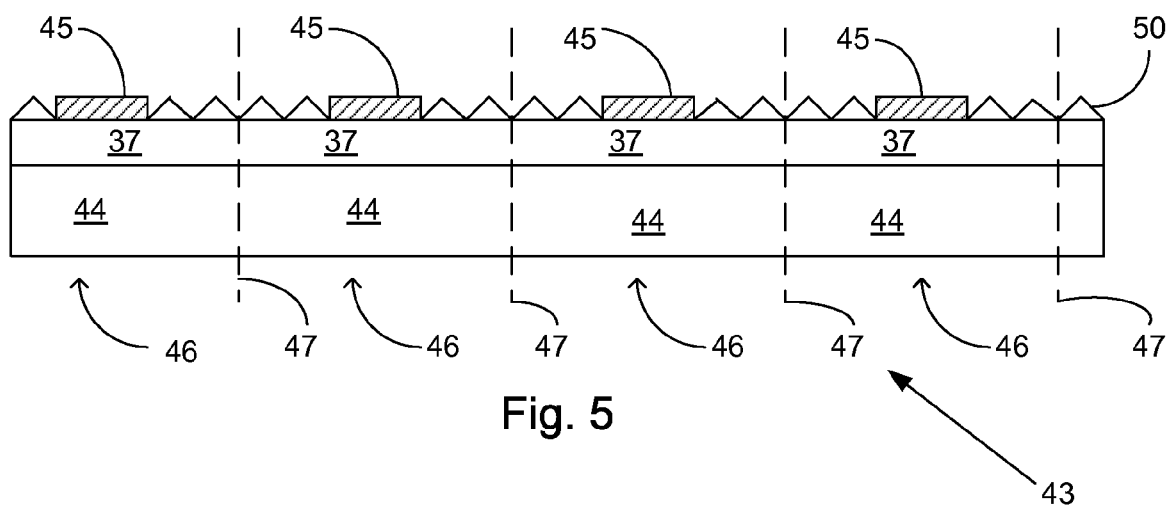
FIG. 5 is a cross sectional schematic diagram of a semiconductor wafer in accordance with the present invention.

FIG. 5 shows the invention in the context of a wafer structure. In one sense, the wafer structure can be an extension of the individual diodes that are formed from the wafer. Thus, FIG. 5 illustrates a wafer broadly designated at 43 that includes a substrate 44, preferably (but not necessarily) a single crystal n-type silicon carbide substrate, a light emitting region 37 that can include one or more light emitting layers or combination of layers that together function to emit light when current is injected through them, and a plurality of discrete ohmic contacts 45 that define a plurality of individual diodes broadly designated at 46 and separated by the guidelines 47. The wafer includes the lenticular silicon carbide surface features designated at 50 on the Group III nitride active region 37.

FIGS. 6 through 10 are scanning electron microscope (SEM) photographs of diodes and portions of diodes according to the present invention.

Figure 6:
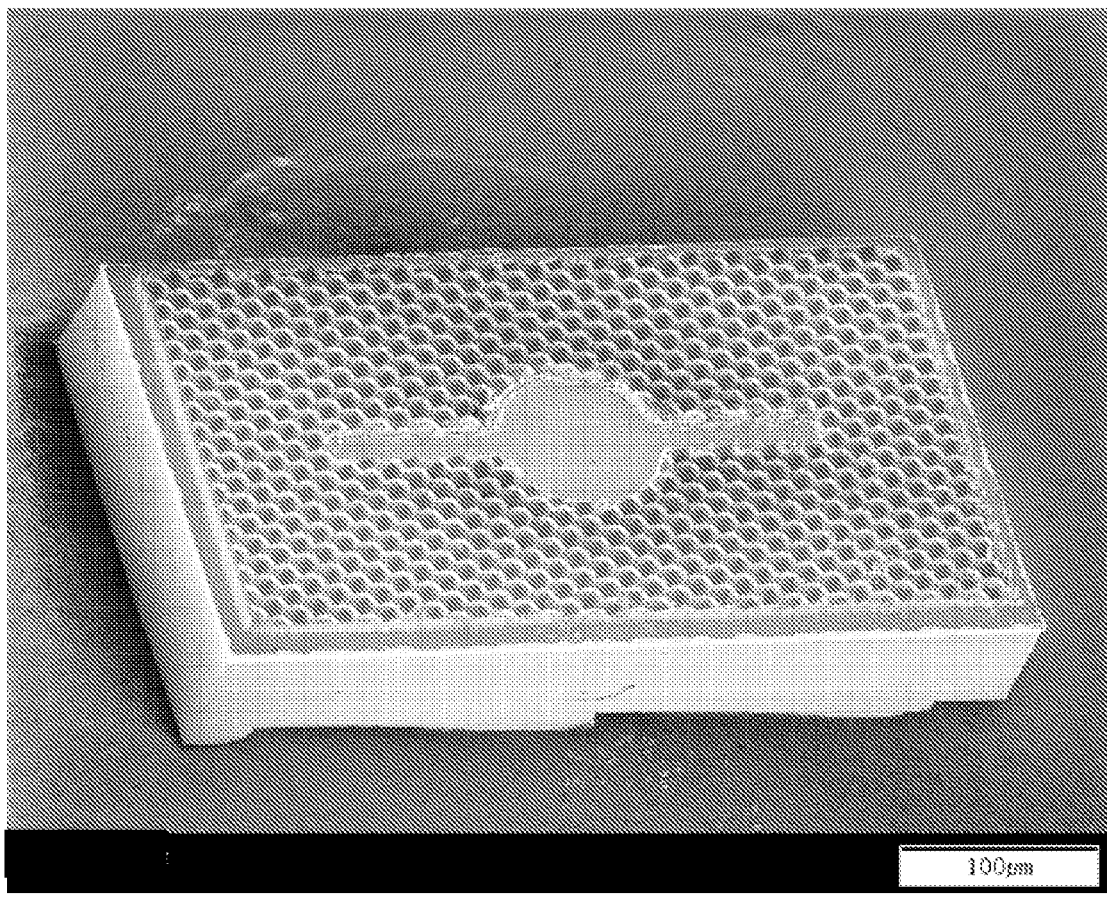
FIG. 6 is a scanning electron microscope (SEM) photograph of a diode according to the present invention.

FIG. 6 is a perspective view of a single light emitting diode according to the present invention. Both the lenticular surface and the top wire bond pad are clearly visible on top of a substrate which is best shown in other of the photographs.

Figure 7:
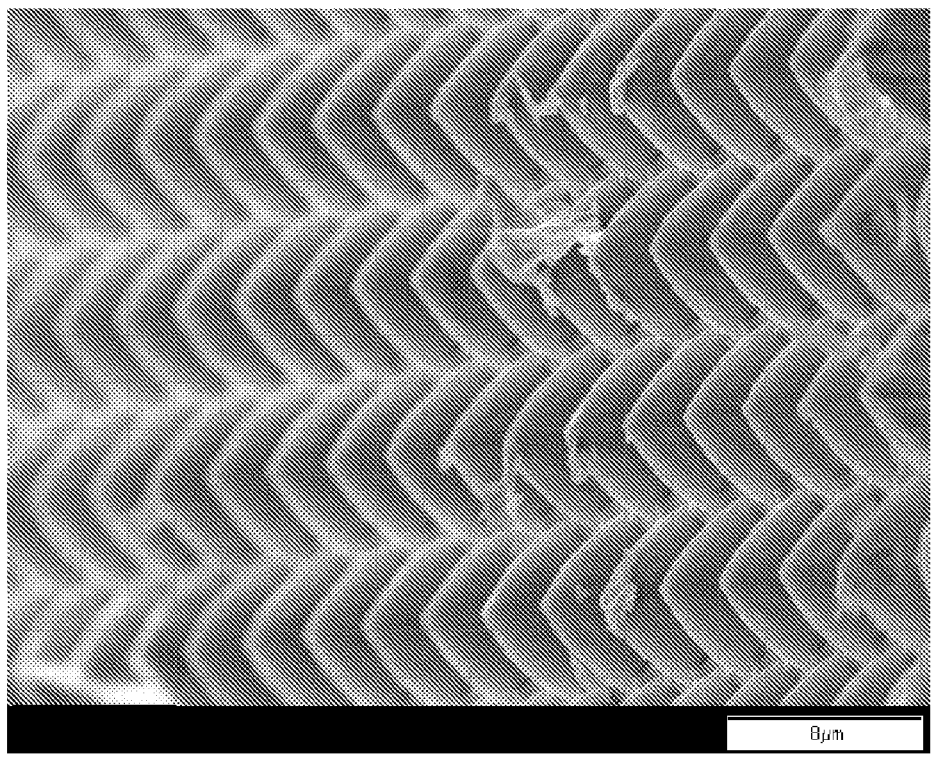
FIGS. 7 and 8 are SEM photographs of the surface of a diode according to the present invention.
Figure 8:
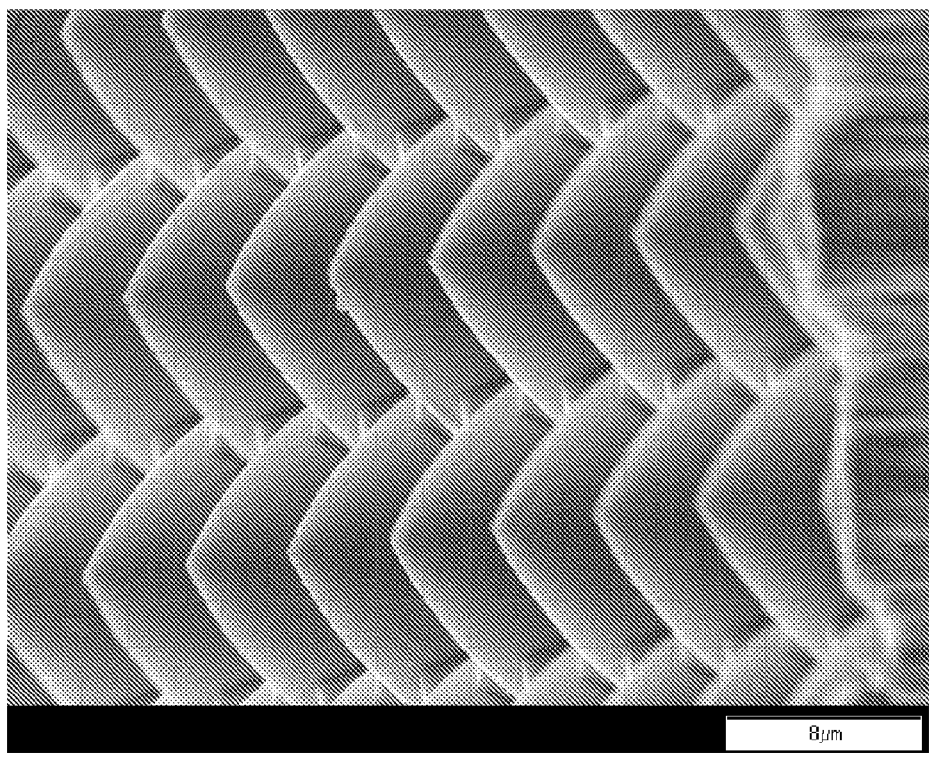

FIGS. 7 and 8 illustrate that the lenticular surface can comprise a plurality of cones. The features may be more accurately described as cone-like because in a geometry sense, a proper solid cone is generated by rotating a right triangle about one of its legs. The slightly rounded shapes of the cones in FIGS. 7 and 8 are thus slightly different from a solid cone, but the description will be understood by those of skill in the art and in context of the photographs. In other embodiments, the lenticular surface can be formed of a plurality of pyramids which are likewise defined as a solid figure contained by planes which is constructed from one plane to one point. Both four-sided and six sided pyramids can be incorporated.

Other shapes for lenticular surfaces can be formed in an almost endless variety depending upon the masking and etching techniques used to form or generate the features. Thus, the invention is not limited to cones, cone-like features or pyramids, but will encompass other lenticular surfaces that can be selected by those of skill in this art and without undue experimentation.

Figure 9:
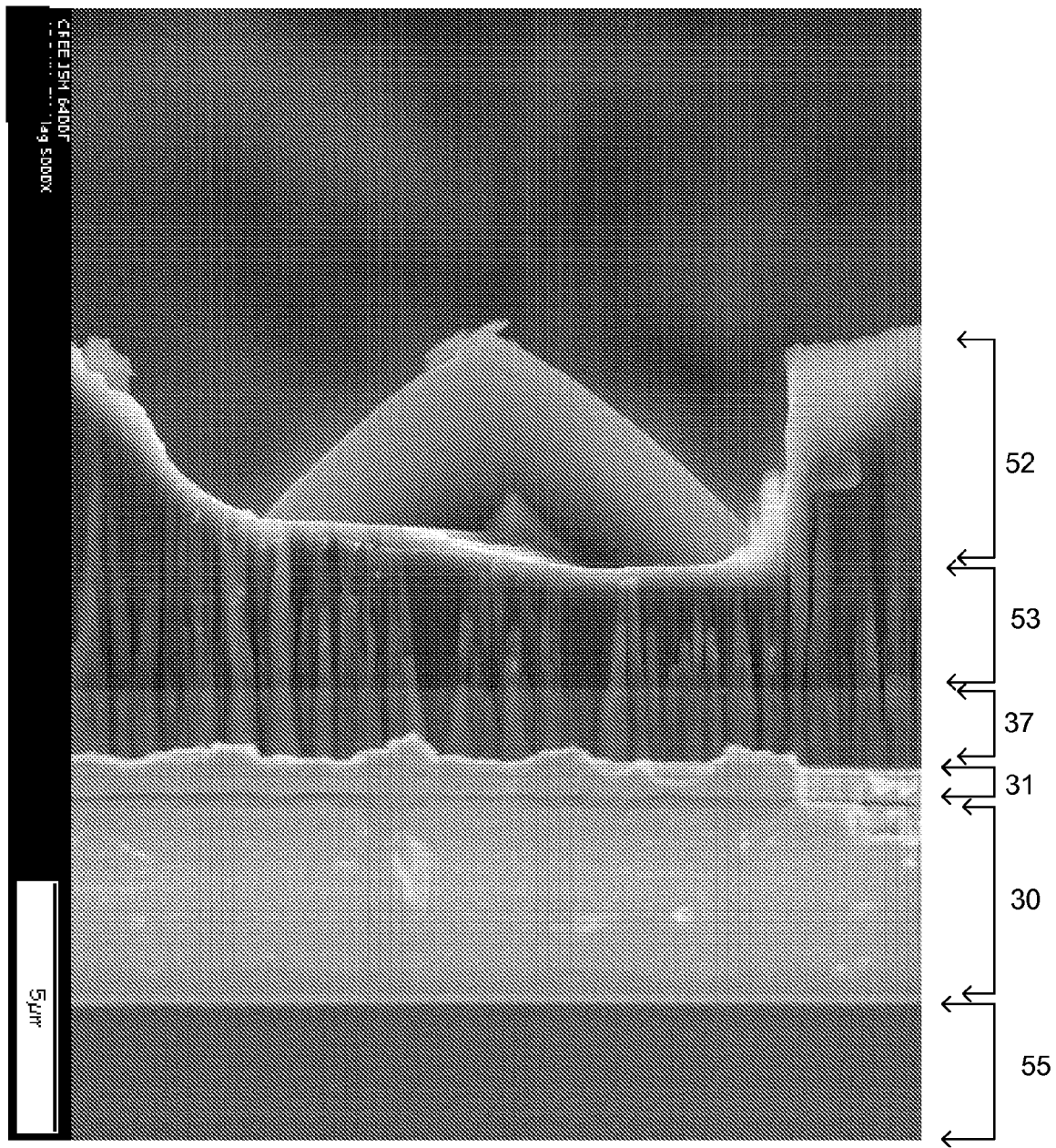
FIG. 9 is an SEM photograph taken cross-sectionally across a diode according to the present invention.

FIG. 9 is a cross-sectional views showing actual examples of some of the features that were illustrated schematically in FIGS. 1-4.

FIG. 9 illustrates the lenticular portion at 52 (to differentiate from the schematic diagrams of FIGS. 1-4). The additional silicon carbide portion below the lenticular features 52 is designated at 53. The light emitting region, including several layers, is designated at 54 and would correspond to region 37 in FIGS. 3 and 4. The substrate is illustrated at 55.

In comparison to other techniques and structures, the invention offers several advantages. For example, the various laser lift-off techniques for reducing the thickness of a substrate (and thus of the resulting diode; e.g., Published Patent Application No. 20030197170) are difficult to carry out in a practical sense without inducing cracking of the wafer. Thus, the substrate removal grinding technique that is compatible with the present invention is expected to give higher yield. Additionally, laser lift-off releases nitrogen gas. In turn, nitrogen release is a major cracking mechanism in these materials systems.

As another benefit, the normally disadvantageous absorption in the silicon carbide is effectively minimized because the volume of the lenticular shapes is likewise minimal.

As another advantage, the absorption coefficient of gallium nitride is generally higher than that of silicon carbide, with the proviso that the absorbency (absorption) of a gallium nitride epitaxial layer cannot be directly compared to a bulk silicon carbide crystal.

As another advantage, gallium nitride will start to exhibit cracking problems at thicknesses of between about 3 and 4 microns when silicon carbide is used as the substrate and at about 5 microns when sapphire is used as a substrate. Thus, the use of the more robust SiC for the lenticular features offers structural advantages.

As another advantage, gallium nitride typically has a defect density in the range of $10^8$ to $10^9$ per cubic centimeter (cm-3). In turn, defects can act as undesired absorption centers. In contrast, the typical defect density in silicon carbide is between about 103 and 104 $cm^{-3}$. Accordingly, incorporating silicon carbide results in a better quality crystal that demonstrates lower defect absorption, which is advantageous for the efficiency of a light emitting diode.

As another advantage, for a given thickness of n-type gallium nitride, the presence of silicon carbide always improves the current spreading. Additionally, silicon carbide gives the greatest latitude for machining or otherwise forming the lenticular surface.

Silicon carbide also has a higher refractive index than gallium nitride, a factor that has no net disadvantage and may provide additional advantages.

FIG. 9 is a scanning electron microscope photograph taken cross-sectionally of a portion of a diode according to the present invention. The various elements of the diode are labeled with the bracketed arrows adjacent the photograph. FIG. 9 accordingly illustrates the lenticular surface 52, and the non-lenticular portion of silicon carbide 53. The light emitting region is again designated at 37, the mirror (and related barrier metals) at 31 and the metal bonding layer at 30. A portion of the substrate is labeled 55 at the bottom of the photograph. The five micron scale adjacent the photograph gives an indication of the relative sizes of the lenticular features and the relative thicknesses of the layers.

Figure 10:
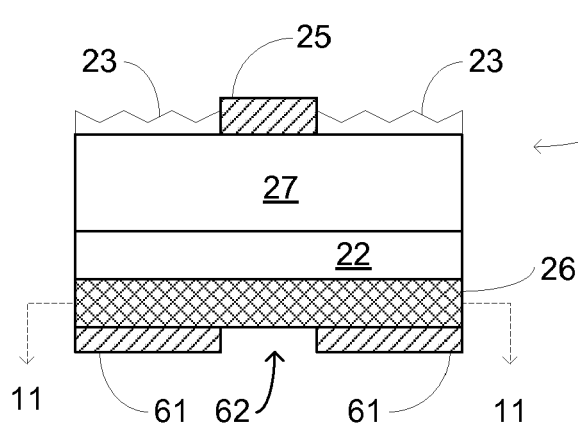
FIG. 10 is a schematic cross-sectional view of another embodiment of a diode according to the present invention.

FIG. 10 is a cross-sectional schematic view of another embodiment of the present invention illustrating portions of a diode structure 60 that enhances the amount of light extraction for a given amount of current applied across the diode. Where possible and helpful, the reference numerals in FIG. 10 are the same as those used in FIGS. 1 through 4. Thus, FIG. 10 includes the wire bond pad 25 on the n-type Group III nitride layer 27. FIG. 10 also illustrates the light emitting layer 22 and the p-type Group III nitride layer 26. The lenticular features are again indicated at 23.

The mirror layer, however, is now designated as 61. In the embodiment illustrated in FIG. 10, the mirror layer 61 is no longer a complete layer of the mirror metal (which also forms a portion of the electrical contact to the active region 37). Instead, a portion of the mirror and contact metals have been removed (or simply not included) to define an opening (designated at 62) adjacent the layer 26 beneath the geometric projection of the wire bond pad 25 through the diode 60. Avoiding metal contact at or over a geometric position projected from the wire bond pad 25 helps direct current flow in the more transparent portions of the diode 60 between the mirror (and related metal) layer 61 and the wire bond pad 25. By eliminating a portion of the mirror 61, the design reduces the number of light-emitting recombinations occurring directly under the wire bond pad 25, and increases the number of recombinations under the more transparent portions of the diode 60. This in turn increases the light extraction from the diode 60 for a given amount of current as compared to a diode in which the mirror and contact system 61 completely covers one side (or the majority of one side) of the diode.

Figure 11:
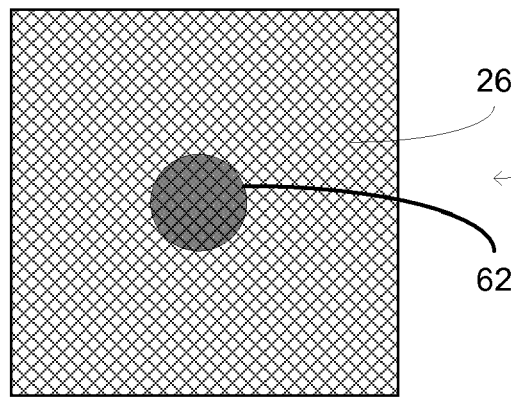
FIG. 11 is a sectional view taken along lines 11-11 of FIG. 10.

FIG. 11 is a top plan view of the diode 60 taken along lines 11-11 in FIG. 10. The layer 26 is again illustrated in the cross-hatched pattern, but the area not included in the mirror (e.g. an opening) is illustrated as the dark circle 62. The opening 62 is indicated with the darker shading because it has a darker appearance when the diode is constructed in the embodiment of FIG. 10.

Figure 12:
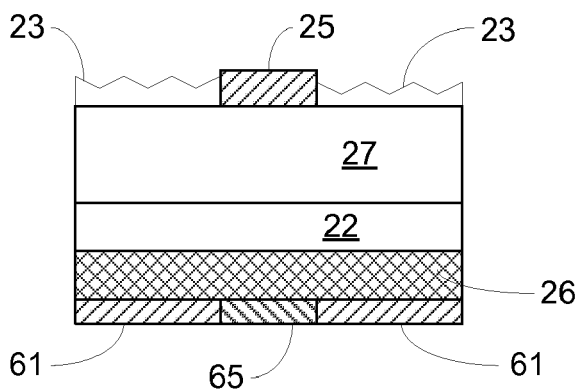
FIGS. 12 and 13 are additional cross-sectional views of additional embodiments of diodes according to the present invention.

FIG. 12 illustrates another embodiment of the diode designated at 64 in which the opening 62 is filled with a reflective metal 65 but one that does not form an ohmic contact with the layer 26. As a result, light extraction from the diode 64 is somewhat better than that of the diode 60 illustrated in FIG. 10 because the mirror 61 includes more reflective area while still providing a structure that minimizes the number of recombinations and emitting events occurring directly under the wire bond pad 25.

Figure 13:
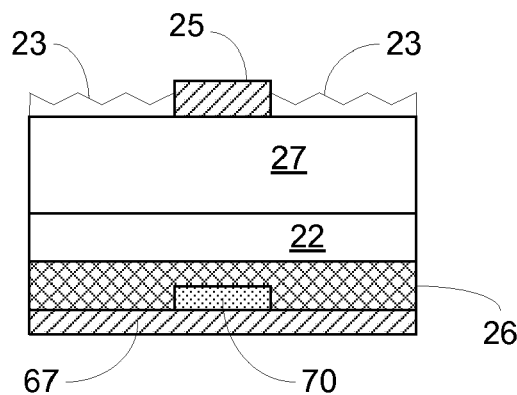

FIG. 13 shows yet another embodiment of the diode designated at 66 in which a portion 70 of the p-type Group III nitride layer 26 is passivated, preferably using a plasma, to be less conductive or even insulating. Because the passivation portion 70 discourages current flow, a full mirror layer 67 can be included in the diode 66 while still serving to minimize the recombinations taking place directly under the wire bond 25.

It will be understood that although FIGS. 10-13 illustrate the opening 62, the alternative metal portion 65, and the passivation portion 70 as being identical in size and geometry to the wire bond pad 25, variations in the size of the opening 62, the alternative metal portion 65, or the passivation layer 70 can be carried out for the same purpose without departing from the scope of the claimed invention.

Figure 14:
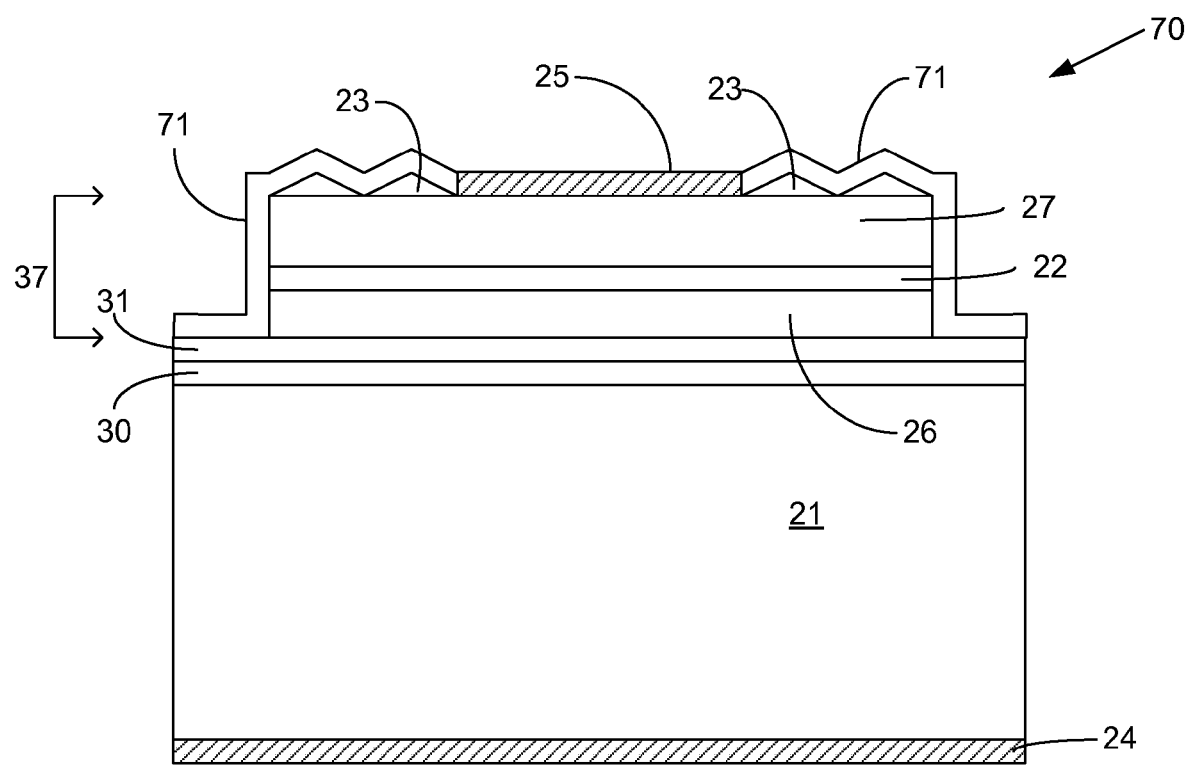
FIG. 14 is a cross-sectional view of a diode with a mesa structure according to the present invention.

FIG. 14 is another embodiment of a diode broadly designated at 70 according to the present invention. The embodiment illustrated at 70 is very similar to the embodiment illustrated in the other figures, with the exception that the light emitting region 37 is in the form of a mesa that in turn includes a passivation layer 71 that covers otherwise exposed portions of the mirror 31 (and any related encapsulating metals) and the bonding metal (or metals) layer 30. Because of the similarity to the other figures, FIG. 14 includes identical reference numerals wherever appropriate. In typical embodiments, the passivation layer covers both the walls of the mesa and the silicon carbide lenticular surface 23. Appropriate passivation materials included silicon nitride (both stoichiometric $Si_3N_4$ and non-stoichiometric) and silicon dioxide ($SiO_2$). It will be understood that these or other passivation materials, and the geometry that they cover or include, are selected for functional compatibility with the diode, including relatively high transparency so as not to interfere with the extraction of light from the diode or otherwise reduce its external efficiency.

In the drawings and specification there has been set forth a preferred embodiment of the invention, and although specific terms have been employed, they are used in a generic and descriptive sense only and not for purposes of limitation, the scope of the invention being defined in the claims.

What is claimed is:

1. In a light emitting diode having a vertical orientation with a top ohmic contact on portions of a top surface of said diode and a mirror layer adjacent the light emitting region of said diode; the improvement comprising:
   an opening in said mirror layer beneath said top ohmic contact through the diode that defines a non-ohmic contact area between said mirror layer and said light emitting region of said diode to encourage current flow to take place other than at said non-ohmic contact area to in turn decrease the number of light emitting recombinations beneath said top ohmic contact and increase the number of light emitting recombinations in the more transparent portions of said diode;
   wherein said opening includes a reflective metal therein that is not ohmic with respect to said light emitting region.

2. A light emitting diode according to claim 1 wherein said top ohmic contact comprises a wire bond pad having an area less than half of the area of said top surface of said diode.

3. A light emitting diode according to claim 1 formed on a substrate and having an ohmic contact to said substrate that is larger in area than said top ohmic contact.

4. A light emitting diode according to claim 3 wherein said mirror layer is positioned between said substrate and said light emitting region.

5. A light emitting diode according to claim 1 wherein the size of said non-ohmic contact area is substantially the same area as the size of said top ohmic contact.

6. A light emitting diode according to claim 1 wherein said mirror layer comprises a plurality of metal layers.

7. A light emitting diode according to claim 1 wherein said light emitting region comprises a plurality of Group III nitride layers, including at least one p-type layer and at least one n-type layer.

8. A light emitting diode according to claim 7 wherein the p-type layer of the light emitting region is on the mirror layer and the opening is adjacent to the p-type layer of the light emitting region.

9. A light emitting diode according to claim 1 wherein the mirror layer has a conductive property and a reflective property.

10. In a light emitting diode having a vertical orientation with a top ohmic contact on portions of a top surface of said diode and a mirror layer adjacent the light emitting region of said diode; the improvement comprising:
    an opening in said mirror layer beneath said top ohmic contact through the diode that defines a non-ohmic contact area between said mirror layer and said light emitting region of said diode to encourage current flow to take place other than at said non-ohmic contact area to in turn decrease the number of light emitting recombinations beneath said top ohmic contact and increase the number of light emitting recombinations in the more transparent portions of said diode;
    wherein said opening is filled with a metal that is not ohmic with respect to said light emitting region to thereby provide additional reflection from said mirror layer.

11. A light emitting diode according to claim 10 wherein said top ohmic contact comprises a wire bond pad having an area less than half of the area of said top surface of said diode.

12. A light emitting diode according to claim 10 formed on a substrate and having an ohmic contact to said substrate that is larger in area than said top ohmic contact.

13. A light emitting diode according to claim 12 wherein said mirror layer is positioned between said substrate and said light emitting region.

14. A light emitting diode according to claim 10 wherein the size of said non-ohmic contact area is substantially the same area as the size of said top ohmic contact.

15. A light emitting diode according to claim 10 wherein said mirror layer comprises a plurality of metal layers.

16. A light emitting diode according to claim 10 wherein said light emitting region comprises a plurality of Group III nitride layers, including at least one p-type layer and at least one n-type layer.

17. A light emitting diode according to claim 10 wherein the light emitting region is on the mirror layer and the opening is adjacent to the light emitting region.

18. A light emitting diode according to claim 16 wherein the p-type layer of the light emitting region is on the mirror layer and the opening is adjacent to the p-type layer of the light emitting region.

19. A light emitting diode according to claim 10 wherein the mirror layer has a conductive property and a reflective property.

* * * * *

UNITED STATES PATENT AND TRADEMARK OFFICE
CERTIFICATE OF CORRECTION

PATENT NO. : 8,154,039 B2  Page 1 of 1
APPLICATION NO. : 12/401832
DATED : April 10, 2012
INVENTOR(S) : Edmond et al.

It is certified that error appears in the above-identified patent and that said Letters Patent is hereby corrected as shown below:

On the Title Page:
Item (75) Inventors: Please correct "John Adam Edmond, Durham, NC"
to read -- John Adam Edmond, Cary, NC --

Signed and Sealed this
Twenty-fifth Day of September, 2012

David J. Kappos
*Director of the United States Patent and Trademark Office*